US011013161B2

(12) United States Patent
Nakayama

(10) Patent No.: US 11,013,161 B2
(45) Date of Patent: May 18, 2021

(54) ELECTRONIC COMPONENT MOUNTER

(71) Applicant: FUJI CORPORATION, Chiryu (JP)

(72) Inventor: Daisuke Nakayama, Toyokawa (JP)

(73) Assignee: FUJI CORPORATION, Chiryu (JP)

( * ) Notice: Subject to any disclaimer, the term of this patent is extended or adjusted under 35 U.S.C. 154(b) by 146 days.

(21) Appl. No.: 16/341,185

(22) PCT Filed: Oct. 21, 2016

(86) PCT No.: PCT/JP2016/081248
§ 371 (c)(1),
(2) Date: Apr. 11, 2019

(87) PCT Pub. No.: WO2018/073952
PCT Pub. Date: Apr. 26, 2018

(65) Prior Publication Data
US 2020/0196497 A1     Jun. 18, 2020

(51) Int. Cl.
*H05K 13/08*     (2006.01)
*H05K 13/04*     (2006.01)

(52) U.S. Cl.
CPC ..... *H05K 13/0812* (2018.08); *H05K 13/0409* (2018.08); *H05K 13/0417* (2013.01);
(Continued)

(58) Field of Classification Search
CPC .......... H05K 13/0069; H05K 13/0092; H05K 13/0409; H05K 13/0417; H05K 13/0443;
(Continued)

(56) References Cited

U.S. PATENT DOCUMENTS 4,286,201 A * 8/1981 Roecks .............. H05K 13/0812
318/640
4,681,452 A * 7/1987 Watanabe ............ G05B 19/408
356/615
(Continued)

FOREIGN PATENT DOCUMENTS

CN     1402610 A     3/2003
CN     101686637 A     3/2010
(Continued)

OTHER PUBLICATIONS

International Search Report dated Jan. 24, 2017 in PCT/JP2016/081248 filed Oct. 21, 2016.
(Continued)

*Primary Examiner* — Peter Dungba Vo
*Assistant Examiner* — Joshua D Anderson
(74) *Attorney, Agent, or Firm* — Oblon, McClelland, Maier & Neustadt, L.L.P.

(57) ABSTRACT

An electronic component mounter is provided which easily detects penetrating portions. An electronic component mounter comprises a holding section configured to hold a board having a penetrating portion penetrating the board in a front-rear direction and into which a lead of an electronic component is inserted; a light section disposed on one face from among the front face and the rear face of the board when the board is held by the holding section and configured to irradiate a light beam, which is direct light or reflected light, on to the board; and a light receiving section disposed on the other face from among the front face and the rear face of the board when the board is held by the holding section and configured to receive the light beam via the penetrating portion.

3 Claims, 6 Drawing Sheets

(52) U.S. Cl.
CPC .... *H05K 13/0473* (2013.01); *Y10T 29/49133* (2015.01); *Y10T 29/49139* (2015.01); *Y10T 29/53183* (2015.01)

(58) Field of Classification Search
CPC .......... H05K 13/0473; H05K 13/0486; H05K 13/0812; H05K 13/0815; H05K 13/083; Y10T 29/49133; Y10T 29/49139; Y10T 29/53091; Y10T 29/53174; Y10T 29/53183
See application file for complete search history.

(56) References Cited

U.S. PATENT DOCUMENTS

| | | | |
|---|---|---|---|
| 5,044,062 A | | 9/1991 | Maskens et al. |
| 6,023,336 A | * | 2/2000 | Hill .................. H01L 21/68 356/399 |
| 2003/0133603 A1 | | 7/2003 | Mitsumoto et al. |

FOREIGN PATENT DOCUMENTS

| | | |
|---|---|---|
| JP | 10-4296 A | 1/1998 |
| JP | 2002-353695 A | 12/2002 |
| JP | 2005-317609 A | 11/2005 |
| JP | 2014-241373 A | 12/2014 |

OTHER PUBLICATIONS

Extended European Search Report dated Oct. 4, 2019 in Patent Application No. 16919240.8, 7 pages.

\* cited by examiner

[Fig. 1]
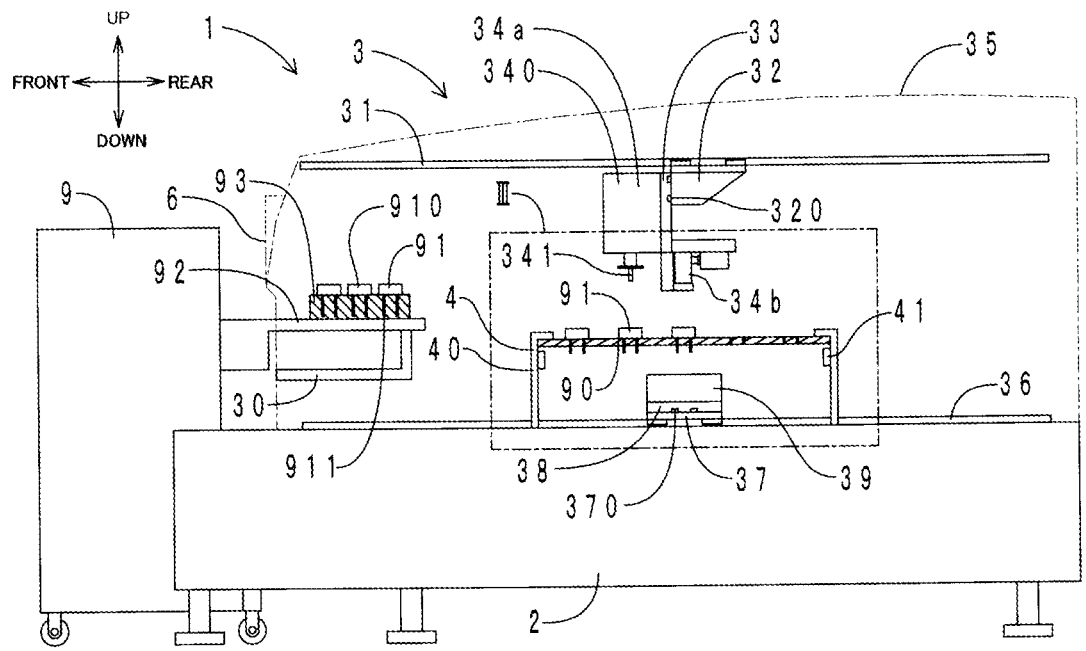
[Fig. 2]
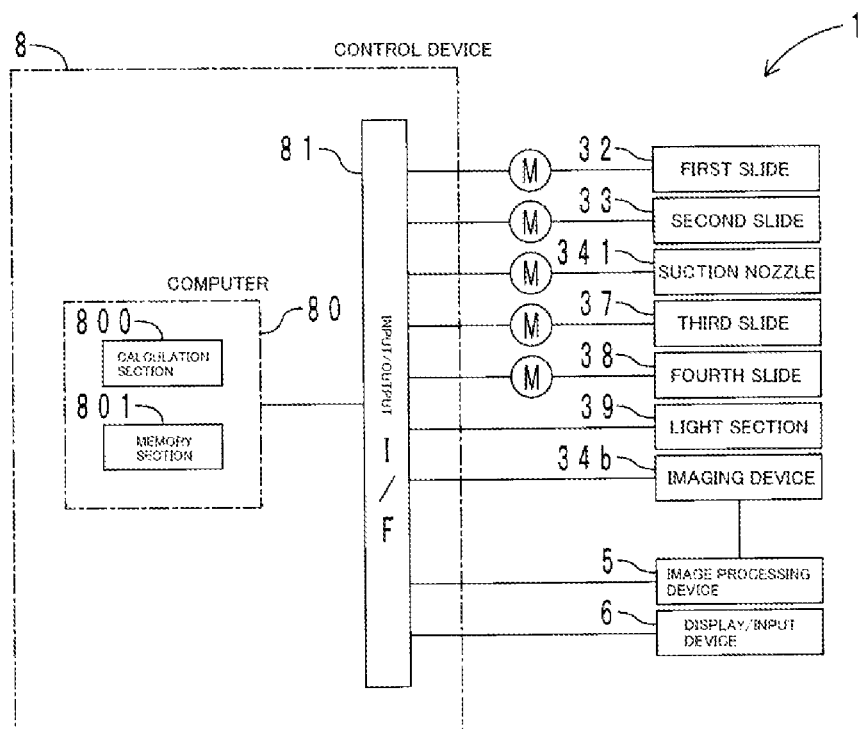

[Fig. 3]
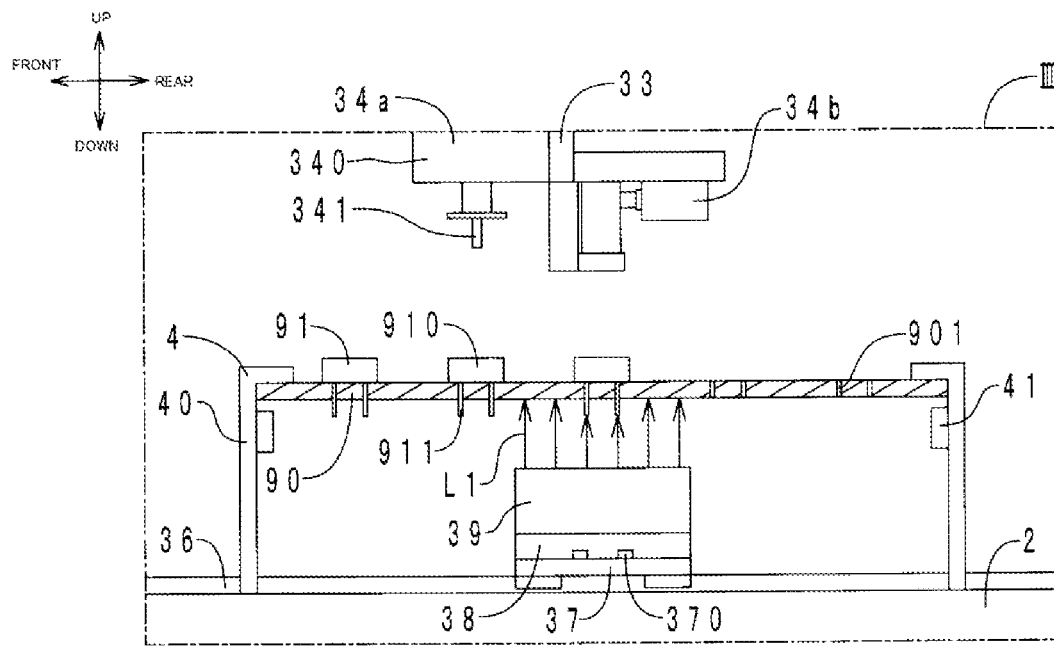
[Fig. 4]
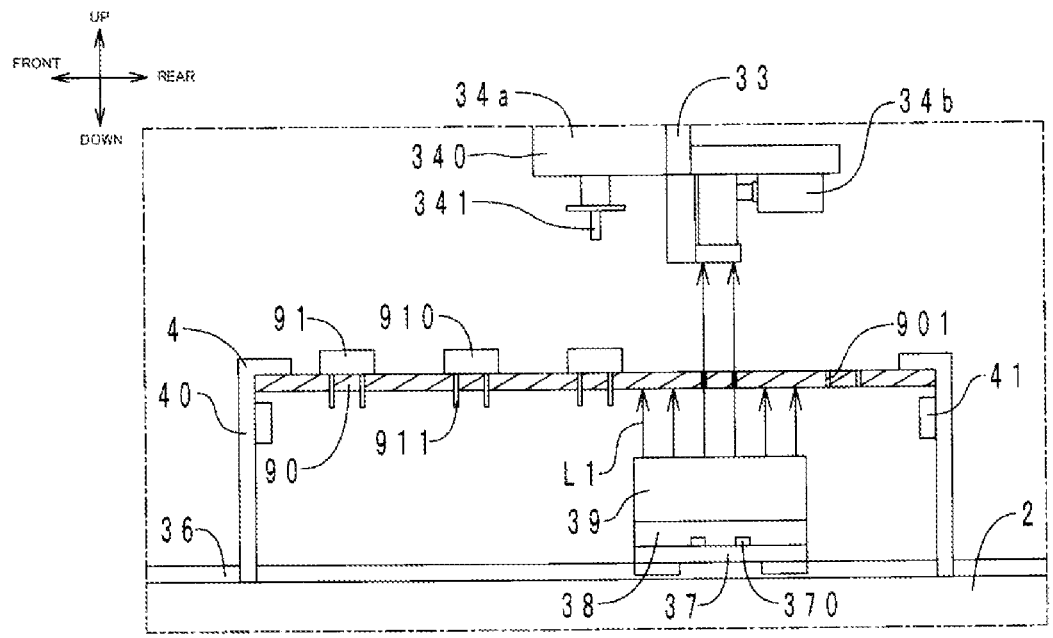

[Fig. 5]
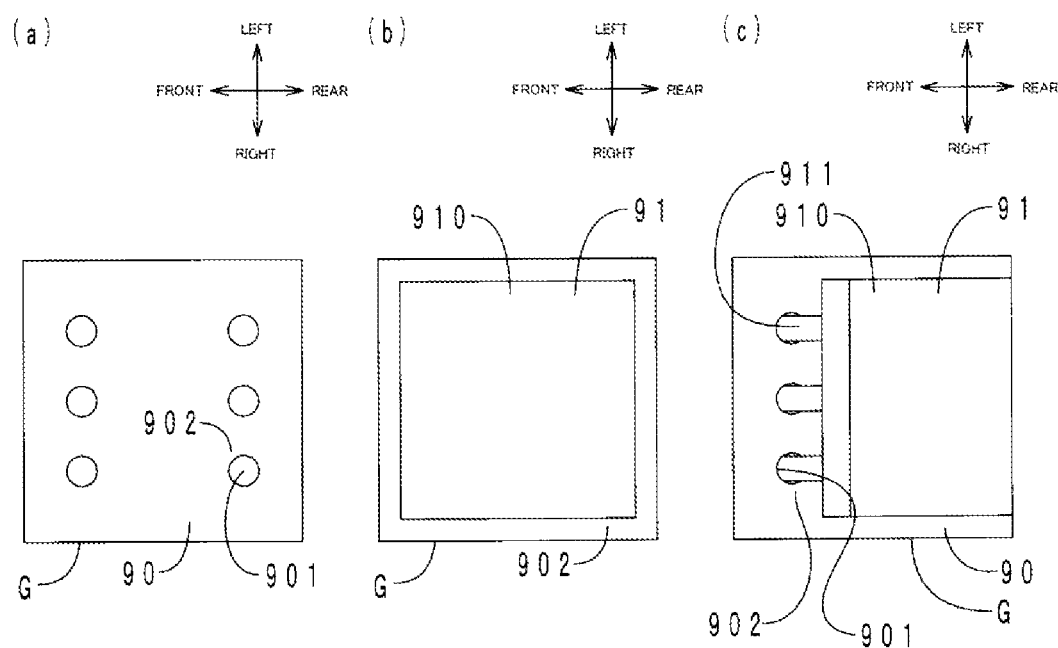

[Fig. 6]
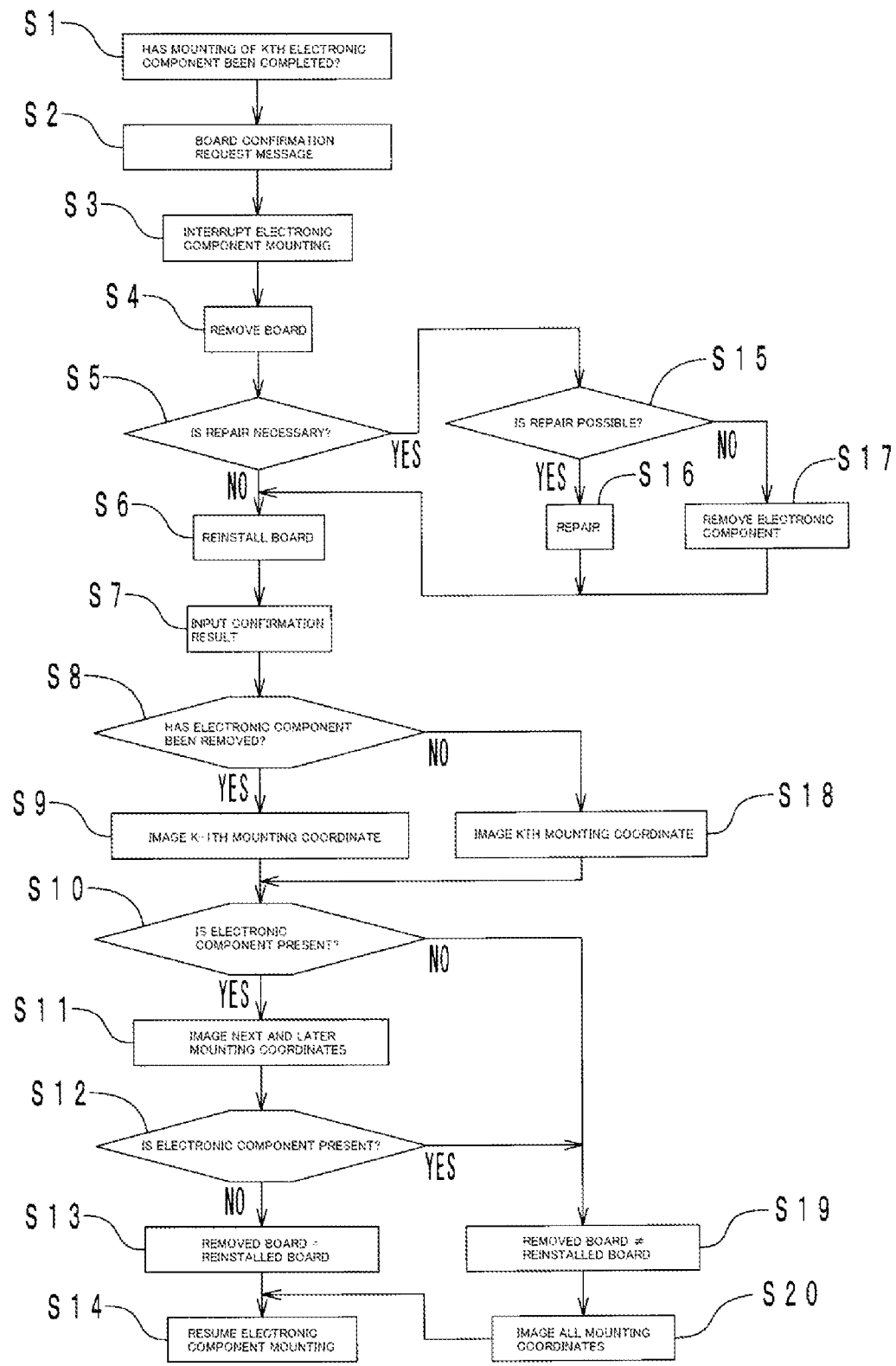

[Fig. 7]
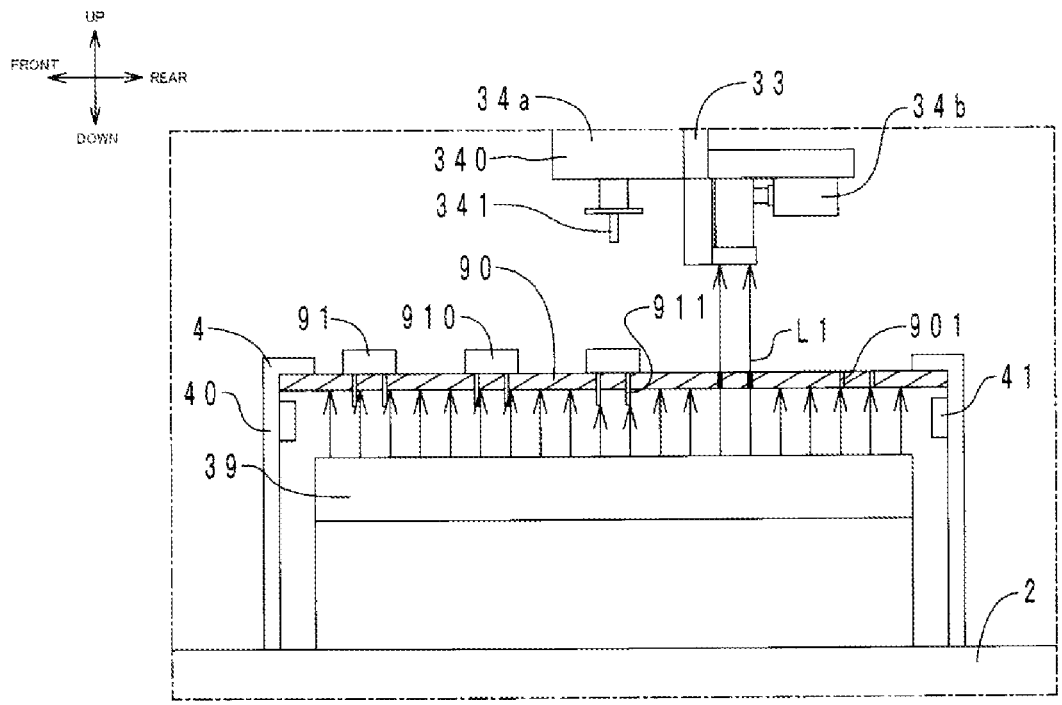
[Fig. 8]
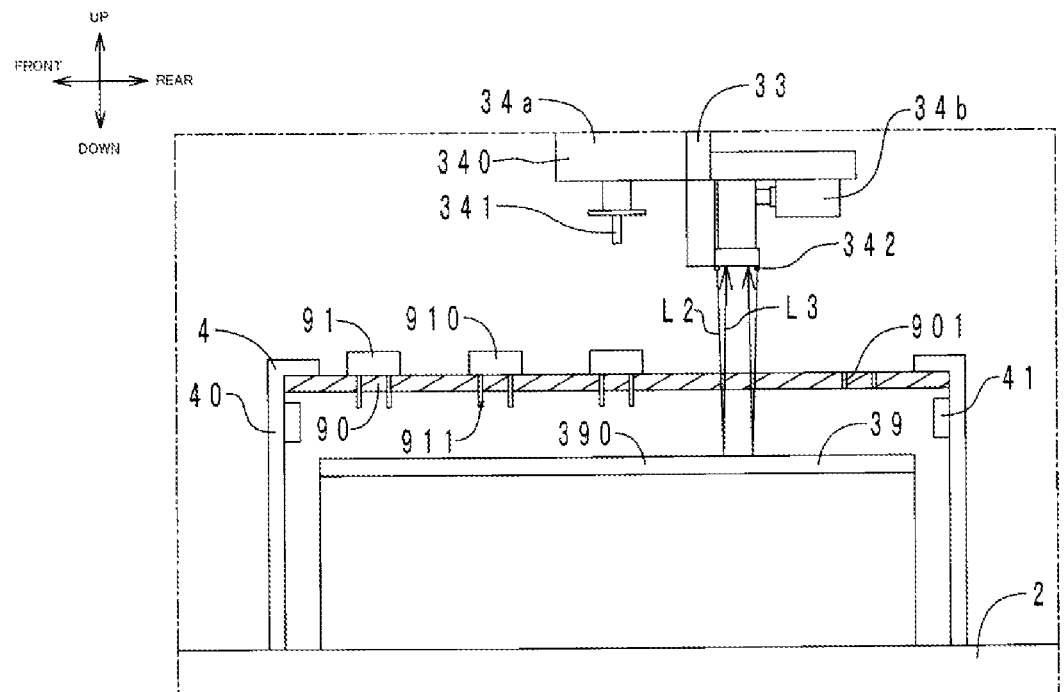

[Fig. 9]
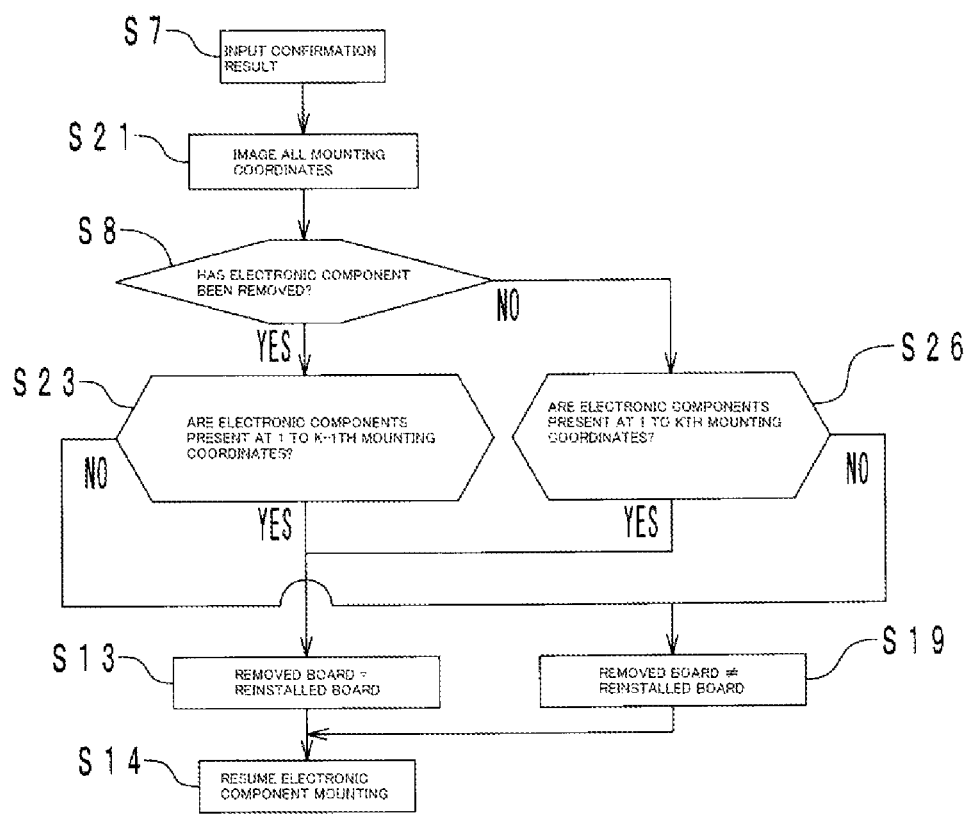

ELECTRONIC COMPONENT MOUNTER

TECHNICAL FIELD

The present application relates to an electronic component mounter configured to mount electronic components on a board.

BACKGROUND ART

An electronic component mounter sequentially mounts multiple electronic components at multiple mounting coordinates on a board. When there is a possibility that an electronic component fails to be mounted, the electronic component mounter temporarily interrupts the mounting work. The operator removes the relevant board from the electronic component mounter and visually checks the board. The operator performs necessary work such as repair or removal of the failed electronic component according to the state of the board and returns the board into the electronic component mounter. The electronic component mounter resumes the mounting work.

However, there may occur a case where due to an erroneous handling of boards by the operator, a board that is removed from the electronic component mounter (hereinafter, referred to as a "removed board" as required) differs from the board that was installed into the electronic component mounter (hereinafter, referred to as a "reinstalled" as required). In this case, the board recognition by the electronic component mounter differs from the actual board state. For this reason, there are fears that such failures will occur as a "lost component" in which an electronic component is not mounted at predetermined mounting coordinates or a "double mounting" in which two electronic components are mounted at predetermined mounting coordinates in a superimposed fashion.

In this regard, Patent Literature 1 discloses an electronic component mounter in which, when resuming the mounting work, the control device identifies the mounting coordinates immediately before resuming and immediately after resuming by referring to a mounting flag (the progress state) of the production program. However, a case is considered where the progress state of the production program differs from the mounting state of electronic components on an actual board.

In this case, Patent Literature 2 discloses an electronic component mounter in which a mounting state of an electronic component on an actual board is imaged by an imaging device. That is, through holes are opened in the board to insert leads of an electronic component. The through holes are positioned so as to correspond to the mounting coordinates of the electronic component. The electronic component mounter of Patent Literature 2 checks the presence of an electronic component by imaging the through holes in the actual board with the imaging device.

PATENT LITERATURES

Patent Literature 1: JP-A-2014-241373
Patent Literature 2: JP-A-2005-317609

BRIEF SUMMARY

Technical Problem

However, the lead through holes are microscopic. Further, on the surface of the board, the contrast between the portion surrounding the through holes and the through holes is low. Due to this, depending on the resolution of an imaging device, it becomes difficult to distinguish the portion surrounding the through holes from the through holes. That is, it is difficult to detect the through holes from the board. Therefore, an object of the present disclosure is to provide an electronic component mounter which facilitates the detection of a penetrating portion.

Solution to Problem (1) To solve the problem described above, according to the present disclosure, there is provided an electronic component mounter comprising: a holding section configured to hold a board having a penetrating portion penetrating the board in a front-rear direction and into which a lead of an electronic component is inserted; a light section, being disposed at a side of the front face or the rear face of the board when the board is held by the holding section, which is configured to irradiate a light beam on to the board, the light beam being direct light or reflected light, and a light receiving section, being disposed on the other side of the front face or the rear face of the board when the board is held by the holding section, which is configured to receive the light beam via the penetrating portion.

Advantageous Effect

With the electronic component mounter of the present disclosure, the difference between the penetrating portion and the other portion (i.e., the portion surrounding the penetrating portion) can be enhanced by the light beam. Due to this, the penetrating portion can be detected easily. Further, with the electronic component mounter of the present disclosure, with the board sandwiched in-between, the light beam can be irradiated on to the penetrating portion from the side opposite the light receiving section. Due to this, compared with a case where the light beam is irradiated on the penetrating portion from only the same side as the light receiving section, the difference between the penetrating portion and portions other than the penetrating portion can be enhanced.

BRIEF DESCRIPTION OF DRAWINGS

FIG. 1 is a right side view of an electronic component mounter according to a first embodiment.

FIG. 2 is a block diagram of the electronic component mounter.

FIG. 3 is an enlarged view of the inside of a frame III illustrated in FIG. 1.

FIG. 4 is a right side view of an area near a board of the electronic component mounter.

FIGS. 5(*a*) to 5(*c*) are schematic views of images imaged by an imaging device (Parts 1 to 3).

FIG. 6 is a flowchart of a board identity determination method performed by the electronic component mounter.

FIG. 7 is a right side view of an area near a board of an electronic component mounter of a second embodiment.

FIG. 8 is a right side view of an area near a board of an electronic component mounter of a third embodiment.

FIG. 9 is a flowchart (of a second half) of a board identity determination method performed by an electronic component mounter of a fourth embodiment.

DETAILED DESCRIPTION OF EMBODIMENTS

Hereinafter, embodiments of an electronic component mounter of the present disclosure will be described.

First Embodiment

FIG. 1 shows a right side view of an electronic component mounter of this embodiment. FIG. 2 shows a block diagram of the electronic component mounter of the embodiment. FIG. 3 shows an enlarged view of the inside of a frame III illustrated in FIG. 1. FIG. 1 shows the right side view of the electronic component as viewed through housing 35 of module 3.

[Configuration of Electronic Component Mounter]

First, the configuration of an electronic component mounter of this embodiment will be described. As illustrated in FIGS. 1, 2, electronic component mounter 1 includes base 2, module 3, imaging device 5 display/input device 6, control device 8, and tray feeder (component supply device) 9.

As illustrated in FIG. 1, tray feeder 9 is detachably disposed at the front face of base 2. Multiple trays (component supply members) 93 are accommodated in tray feeder 9. Module 3 is detachably disposed on the upper surface of base 2. Display/input device 6 is disposed at the front face of module 3. Display/input device 6 constitutes a touch panel.

Module 3 includes device table 30, pair of left and right first guide rails 31, first slide 32, second slide 33, mounting head 34a, imaging device 34b, housing 35, pair of left and right third guide rails 36, third slide 37, fourth slide 38, light section 39, and holding section 4.

Device table 30 is disposed in an opening at the front side (working area side) of housing 35 of module 3. Pair of left and right arms 92 of tray feeder 9 are disposed on device table 30. Tray 93 is placed to extend over pair of left and right arms 92. Multiple electronic components 91 are accommodated in tray 93. Electronic component 91 includes component main body 910 and multiple leads 911.

Pair of left and right first guide rails 31 are disposed on the inner face (i.e., the upper face) of housing 35 of module 3. First slide 32 can move in a front-rear direction along pair of left and right guide rails 31 using a drive force of motor (servo motor) M. Pair of upper and lower second guide rails 320 are disposed at the front face of first slide 32. Second slide 33 can move in a left-right direction along pair of upper and lower second guide rails 320 using the drive force of motor (servomotor) M.

As illustrated in FIG. 3, mounting head 34a includes head main body 340 and suction nozzle 341. Second slide 33 is attached to head main body 340. Suction nozzle 341 can descend from head main body 340 using the drive force of motor (servomotor) M. That is, suction nozzle 341 can move in the front-rear, left-right, and up-down directions. Suction nozzle 341 can pick up electronic component 91 through suction produced by negative pressure. Imaging device 34b is attached to second slide 33. Specifically, imaging device 34b is disposed above the upper face (i.e., the front face) of board 90. Imaging device 34b can move in the front-rear and left-right directions. Imaging device 34b includes a charge-coupled device (CCD) area sensor. The visual field of imaging device 34b is directed downwards (towards the upper face (i.e., the front face) of board 90).

Pair of left and right third guide rails 36 are disposed on the inner face (i.e., the lower face) of housing 35 of module 3. Third slide 37 can move in the front-rear direction along pair of left and right third guide rails 36 using the drive force of motor (servomotor) M. Pair of front and rear fourth guide rails 370 are disposed on the upper face of third slide 37. Fourth slide 38 can move in the left-right direction along pair of front and rear fourth guide rails 370 using the drive force of motor (servomotor) M.

Light section 39 is attached to fourth slide 38. That is, light section 39 is disposed below the lower face (i.e., the rear face) of board 90. Light section 39 can move in the front-rear and left-right directions. Light section 39 includes a light source having a light-emitting diode (LED). Light section 39 can irradiate direct light (light beam) L1 upwards (towards the lower face (i.e., the rear face) of board 90).

Holding section 4 includes pair of front and rear wall sections 40, conveyor 41, and a backup section (not shown). Pair of front and rear wall sections 40 are disposed on the upper face of base 2. Pair of front and rear wall sections 40 exhibit a C-shape that straddles a space defined between pair left and right third guide rails 36 and which is opened downwards. The upper end (i.e., the clamp claw) of wall section 40 is bent inwards (i.e., the upper end (the clamp claw) of front-side wall section 40 is bent rearwards, and the upper end (i.e., the clamp claw) of rear-side wall section 40 is bent forwards). Rear-side wall section 40 can move in a front-rear direction along a pair of left and right guide rails (not shown). Conveyor 41 includes a pair of front and rear belts. The belts extend in the left-right direction (i.e., the board conveyance direction). The pair of front and rear belts are disposed on inner faces of pair of front and rear wall sections 40 so as to face each other in the front-rear direction. Board 90 is conveyed by the pair of front and rear belts. Multiple through holes 901 are opened in board 90. Through holes 901 are embodied by the concept of a "penetrating portion" in the present disclosure. Leads 911 of electronic component 91 are inserted into through holes 901. Through holes 901 are positioned so as to correspond to the mounting coordinates of electronic component 91. The backup section is disposed between pair of front and rear wall sections 40. When mounting electronic component 91, board 90 is held and fixed from above and below by the backup section and the upper ends of pair of front and rear wall sections 40.

As illustrated in FIG. 2, control device 8 includes computer 80 and input/output interface 81. Computer 80 includes calculating section 800 and memory section 801. Memory section 801 stores data regarding board 90, electronic component 91, mounting coordinates of electronic components 91 on board 90, and the like. Input/output interface 81 is electrically connected to motors M for driving first slide 32, second slide 33, suction nozzle 341, third slide 37, and fourth slide 38. Further, input/output interface 81 is electrically connected to light section 39, imaging device 34b, image processing device 5, and display/input device 6.

[Imaging Method]

Next, a method for imaging a board and an electronic component by the electronic component mounter of this embodiment will be described. FIG. 4 illustrates a right side view of an area near the board of the electronic component mounter of this embodiment. FIG. 4 corresponds to FIG. 3. Further, FIG. 3 illustrates a case where electronic component 91 is mounted at mounting coordinates to be imaged. FIG. 4 illustrates a case where electronic component 91 is not mounted at mounting coordinates to be imaged. FIGS. 5(a) to 5(c) illustrate schematic views (Parts 1 to 3) of images imaged by the imaging device.

The imaging method includes a moving step and an imaging step. In the moving step, as illustrated in FIGS. 2 to 4, control device 8 drives first slide 32, second slide 33, third slide 37, and fourth slide 38 as required. Then, imaging device 34b and light section 39 are caused to face each other in the up-down direction with desired mounting coordinates on board 90 positioned therebetween. In the imaging step, control device 8 illuminates light section 39, and imaging device 34b images the upper face of board 90. Image G imaged by imaging device 34b is image processed by image processing device 5 and transmitted to control device 8. Image G is embodied by the concept of "information regarding mounting coordinates" of the present disclosure. Image processing device 5 can control a gain value and an offset value of image G so that an average brightness difference between through hole 901, which will be described later, and a surrounding hole portion (i.e., a portion surrounding the circumference of through hole 901) 902 maximized.

With no electronic component 91 mounted at the mounting coordinates, that is, nothing inserted in through holes 901 (i.e., the reference state) as illustrated in FIG. 4, through holes 901 and hole surrounding portion 902 are drawn in image G, as illustrated in FIG. 5(a). Through holes 901 transmit direct light L1 from light section 39. On the other hand, hole surrounding portion 902 cuts off direct light L1. Due to this, direct light L1 enters imaging device 34b via through holes 901. Therefore, in image G, the contrast between through holes 901 and hole surrounding portion 902 is enhanced.

As illustrated in FIG. 3, with electronic component 91 properly mounted at the mounting coordinates (i.e., the normal mounting state), electronic component 91 and hole surrounding portion 902 are drawn in image G, as illustrated in FIG. 5(b). That is, since through holes 901 are hidden under the lower side of component main body 910, no through hole 901 is drawn. Electronic component 91 and hole surrounding portion 902 cut off direct light L1. Due to this, direct light L1 does not enter imaging device 34b.

With electronic component 91 being mounted inclined in a mounting state (i.e., an inclined mounting state), electronic component 91, through holes 901, and hole surrounding portion 902 are drawn in image G, as illustrated in FIG. 5(c). Through holes 901 (specifically, gaps between holes 901 and leads 911) allow direct light L1 from light section 39 to pass there-through. On the other hand, electronic component 91 and hole surrounding portion 902 cut off direct light L1. Due to this, direct light L1 enters imaging device 34b via through holes 901. Consequently, the contrast between through holes 901 and electronic component 91 and hole surrounding portion 902 is enhanced in image G.

In this way, when direct light L1 is shone from the lower side of board 90, direct light L1 leaks to the upper side of board 90 via through holes 901. This allows only through holes 901 to be made selectively conspicuous in image G.

Control device 8 can determine whether electronic component 91 is present at the mounting coordinates by comparing image G of the reference state illustrated in FIG. 5(a) with an actually imaged image (for example, the image of the normal mounting state illustrated in FIG. 5(b) or the image of the inclined mounting state illustrated in FIG. 5(c)).

[Board Identity Determination Method]

Next, a board identity determination method performed by the electronic component mounter of the embodiment will be described. The imaging method described above is made use of in the board identity determination method. The board identity determination method is executed when sequentially mounting multiple electronic components 91 on board 90. Specifically, in a case where board 90 is removed temporarily from electronic component mounter 1 and reinstalled in electronic component mounter 1, the board identity determination method is executed to determine the difference between removed board (i.e., the board removed from electronic component mounter 1) 90 and reinstalled board (i.e., the board reinstalled into electronic component mounter 1) 90.

FIG. 6 illustrates a flowchart of the board identity determination method executed by the electronic component mounter of the embodiment. Hereinafter, a case is assumed where N (N is an integer of 3 or greater) electronic components 91 are sequentially mounted (from 1 to N) at N mounting coordinates on board 90 by electronic component mounter 1 illustrated in FIG. 1.

After mounting of kth (k is an integer of 2 or greater and smaller than N) electronic component 91 is completed (S1 (step 1, S denoting a step, which will be true hereinafter), in FIG. 6.). When control device 8 illustrated in FIG. 2 determines that the mounting state is defective, control device 8 displays a board check request message on display/input device 6 (S2 in FIG. 6). For example, control device 8 displays a message reading, "Please check the mounting state of kth electronic component 91," on display/input device 6. Control device 8 does not proceed to mounting k+1th electronic component 91. That is, control device 8 interrupts the mounting work of electronic components 91 (S3 in FIG. 6). When reading the board check request message, the operator removes board 90 from electronic component mounter 1 and checks the mounting state of kth electronic component 91 (S4 in FIG. 6). 1st to kth components 91 are mounted on removed board 90. Additionally, k+1th to Nth electronic components 91 are not mounted on removed board 90.

In the case where, as a result of the check, it is found that a repair is not required (i.e., the mounting state is not abnormal) (S5 in FIG. 6), the operator reinstalls board 90 into electronic component mounter 1 (S6 in FIG. 6). On the other hand, in the case where, as a result of the check, it is found that a repair is required (S5 in FIG. 6) and the repair is possible (S15 in FIG. 6), the operator repairs the mounting state of kth electronic component 91 (S16 in FIG. 6). Thereafter, the operator reinstalls board 90 into electronic component mounter 1 (S6 in FIG. 6). Further, in the case where, as a result of the check, it is found that a repair is required (S5 in FIG. 6) and the repair is not possible (S15 in FIG. 6), the operator removes kth electronic component 91 from board 90 (S17 in FIG. 6). Thereafter, the operator reinstalls board 90 into electronic component mounter 1 (S6 in FIG. 6).

The operator inputs a reply to the board check request message into display/input device 6 (S7 in FIG. 6). That is, the operator inputs the results of checking the mounting state of kth electronic component 91. For example, the operator touches a button corresponding to the results of the check from among multiple software buttons ("No Repair Required," "Repaired," and "Removed") displayed on display/input device 6.

When determining based on the results of the check by the operator that "kth electronic component 91 has been removed" (S8 in FIG. 6), control device 8 images mounting coordinates for k−1th electronic component 91 using the imaging method (moving step, imaging step) described above (S9 in FIG. 6). That is, when kth electronic component 91 is removed, 1st to k−1th electronic components 91 are mounted on reinstalled board 90. Additionally, kth to Nth electronic components 91 are not mounted on reinstalled board 90. Due to this, the latest electronic component (i.e., the electronic component mounted immediately before now) 91 on board 90 is k−1th electronic component 91. Consequently, control device 8 images the mounting coordinate of k−1th electronic component 91.

When images G illustrated in FIG. 5(b) (the normal mounting state) and FIG. 5(c) (the inclined mounting state) are acquired as a result of imaging the relevant mounting coordinate, control device 8 determines that k−1th electronic component 91 is mounted (S10 in FIG. 6). As this occurs, control device 8 continues imaging mounting coordinates for kth to Nth electronic components 91 (S11 in FIG. 6).

When image G illustrated in FIG. 5(a) (the reference state) is acquired at all the imaged mounting coordinates as a result of imaging the mounting coordinates, control device 8 determines that kth to Nth electronic components 91 are not mounted (S12 in FIG. 6). That is, control device 8 determines that k−1th electronic component 91 are mounted but kth to Nth electronic components 91 are not mounted on reinstalled board 90. The mounting state of electronic components 91 on relevant board 90 coincides with the mounting state of electronic component 91 on reinstalled board (i.e., the board from which kth electronic component 91 is removed) 90. Due to this, control device 8 determines that removed board 90 is identical to reinstalled board 90 (S13 in FIG. 6). Thereafter, control device 8 resumes mounting electronic components from kth electronic component 91 (S14 in FIG. 6).

On the other hand, returning to S9 in FIG. 6, when image G illustrated in FIG. 5(a) (i.e., the reference state) is acquired as a result of imaging the mounting coordinates, control device 8 determines that k−1th electronic component 91 is not mounted (S10 in FIG. 6). The mounting state of electronic component 91 on relevant board 90 does not coincide with the mounting state of electronic component 91 on reinstalled board (i.e., the board from which kth electronic component 91 is removed) 90. Due to this, control device 8 determines that removed board 90 is not identical to reinstalled board 90 (S19 in FIG. 6). In this case, control device 8 images all electronic component 91 mounting coordinates (S20 in FIG. 6). Thereafter, control device 8 resumes mounting electronic component 91 on all mounting coordinates where electronic component 91 is not mounted (S14 in FIG. 6).

Similarly, returning to S11 in FIG. 6, when image G illustrated in FIG. 5(b) (the normal mounting state) or FIG. 5(c) (the inclined mounting state) is acquired from at least one of the imaged mounting coordinates as a result of imaging the mountings, control device 8 determines that at least one of kth to Nth electronic components 91 is mounted (S12 in FIG. 6). The mounting state of electronic component 91 on relevant board 90 does not coincide with the mounting state of electronic component 91 on reinstalled board (i.e., the board from which kth electronic component 91 is removed) 90. Due to this, control device 8 determines that removed board 90 is not identical to reinstalled board 90 (S19 in FIG. 6). In this case, control device 8 images all electronic component 91 mounting coordinates (S20 in FIG. 6). Thereafter, control device 8 resumes mounting electronic component 91 on all mounting coordinates where electronic component 91 is not mounted (S14 in FIG. 6).

On the other hand, returning to S8 in FIG. 6, when it is not determined based on the results of the check by the operator that "kth electronic component 91 is removed" (i.e., when the operator touches the button displaying "No Repair Required," or "Repaired" in S7 in FIG. 6), control device 8 images the mounting coordinates the $k_{th}$ electronic component 91 using the imaging method described above (S18 in FIG. 6). That is, 1st to $k_{th}$ electronic components 91 are mounted on reinstalled board 90. Further, $k+1_{th}$ to $N_{th}$ electronic components 91 are not mounted on reinstalled board 90. Due to this, the latest electronic component (electronic component 91 mounted immediately before now) 91 on board 90 is $k_{th}$ electronic component 91. Consequently, control device 8 images $k_{th}$ electronic component 91 mounting coordinates. Thereafter, control device 8 executes steps on and after S10 in FIG. 6 as required, as described above.

Working Effects

Next, working effects of the electronic component mounter of this embodiment will be described. As illustrated in FIGS. 4, 5(a), with electronic component mounter 1 of this embodiment, the contrast between through holes 901 and hole surrounding portion 902 can be enhanced by direct light L1. Due to this, control device 8, illustrated in FIG. 2, can easily detect through holes 901. Consequently, control device 8 can determine the reference state illustrated in FIG. 5(a), the normal mounting state illustrated on FIG. 5(b), and the inclined mounting state illustrated in FIG. 5(c).

In addition, as illustrated in FIG. 4, electronic component mounter 1 of this embodiment includes light section 39 configured to light up board 90 from below. That is, electronic component mounter 1 includes light section 39 that was previously unnecessary for imaging the upper face (i.e., electronic component 91 mounting face) of board 90. Due to this, with board sandwiched in-between, direct light L1 can be irradiated on through holes 901 from the opposite side (i.e., the lower face of board 90) of board 90 to the side facing imaging device 34b. Consequently, when compared with the case where a light beam is irradiated on through holes 901 only from the same side (i.e., the upper face of board 90) of board 90 as the side facing imaging device 34b, the contrast between through holes 901 and hole surrounding portion 902 can be enhanced.

Further, with electronic component mounter 1 of this embodiment, board 90 can be lit up from above when detecting through holes 901. By doing so, with the board 90 sandwiched in-between, direct light L1 can be irradiated on through holes 901 only from the side opposite to imaging device 34b. Consequently, when compared with the case where light beams are irradiated on through holes 901 from the same side as the side as imaging device 34b and opposite to imaging device 34b, the contrast between through holes 901 and hole surrounding portion 902 can be enhanced.

Fiducial marks (not shown) are located on the upper face of board 90 to position electronic components 91 when mounting them. Imaging device 34b was originally used to image these fiducial marks. In this respect, with electronic component mounter 1 of this embodiment, fiducial mark (board 90) imaging device 34b is used to image through holes 901 (for board 90 and electronic components 91). Due to this, compared with a case where an imaging device dedicated to through hole 901 is provided, the number of components is reduced. The functions of the electronic component mounter of this embodiment can easily be added to an existing electronic component mounter 1.

Additionally, a cutting and clinching device (not shown) is disposed on the lower side of board 90 to cut and bend lower ends (i.e., surplus portions) of leads 911 illustrated in FIGS. 3, 4. Fourth slide 38 was originally used to move the cutting and clinching device. In this respect, in electronic component mounter 1 of the embodiment, use of fourth slide 38 for the cutting and clinching device is diverted to light section 39. Due to this, when compared to a case where a dedicated slide for light section 39 is provided, the number of components is reduced. The functions of the electronic component mounter of this embodiment can easily be added to an existing electronic component mounter 1.

Incidentally, an identifier can be attached to board 90 to distinguish between removed board 90 and reinstalled board 90. In this case, electronic component mounter 1 can distinguish between removed board 90 and reinstalled board 90 based on the identifier. However, there may be a case where no identifier can be attached to board 90 due to a limitation of space on board 90 or a limitation on cost. In contrast with this, with electronic component mounter 1 of this embodiment, the removed board 90 can be distinguished from reinstalled board 90 depending on the space on board 90. Further, since an identifier need not be attached to board 90, the cost for attaching such an identifier is unnecessary.

Second Embodiment

An electronic component mounter of this embodiment and the electronic component mounter of the first embodiment differ from each other in that the light section is fixed in this embodiment. Here, only the different features will be described. FIG. 7 illustrates a right side view of an area near a board of the electronic component mounter of this embodiment. The same reference signs will be given to portions corresponding to illustrated in FIG. 4. As illustrated in FIG. 7, light section 39 is fixed to the upper face of base 2. When seen from above, all mounting coordinates (i.e., through holes 901) on board 90 and light section 39 are superposed over or below each other.

The electronic component mounter of this embodiment and the electronic component mounter of the first embodiment provide the same working effects in relation to common portions in the configuration. In the electronic component mounter of this embodiment, a single light section 39 is disposed below all through holes 901 in board 90. Due to this, direct light L1 can be irradiated on all through holes 901 without moving light section 39. Consequently, a driving mechanism (for example, third slide 37 or fourth slide 38 which are illustrated in FIG. 4) for light section 39 becomes unnecessary.

Third Embodiment

An electronic component mounter of this embodiment differs from the electronic component mounter of the second embodiment in that the imaging device has a light source. Further, the two electronic component mounters differ in that the light section has a reflective body. Here, only the different features will be described.

FIG. 8 illustrates a right side view of an area near a board of the electronic component mounter of this embodiment. The same reference signs will be given to portions corresponding to those illustrated in FIG. 4. As illustrated in FIG. 8, light source 342 having an LED is disposed on imaging device 34b. Light source 342 can irradiate incident light L2 downwards (towards the upper face (i.e., the front face) of board 90). On the other hand, light section 39 is fixed to the upper face of base 2. Light section 39 includes reflective body 390 with a white upper face. When seen from above, all mounting coordinates (through holes 901) on board 90 and reflective body 390 are superposed over or below each other.

Incident light L2 from the light source passes through holes 901 from the upper side (i.e., the front face) towards the lower side (i.e., the rear face). Incident light L2 which has passed through holes 901 is reflected by the upper face of reflective body 390. Reflected light L3 passes through holes 901 from the lower side towards the upper side. Reflected light L3 which has passed through holes 901 is incident on imaging device 34b.

The electronic component mounter of this embodiment and the electronic component mounter of the second embodiment provide the same working effects in relation to common portions in the configuration. According to the electronic component mounter of this embodiment, when the light source is attached to fiducial mark (board 90) imaging device 34b, the light source can be used for through holes 901 (for board 90 and electronic components 91). Due to this, compared with a case where a dedicated light source for through holes 901 is provided, the number of components is reduced. The functions of the electronic component mounter of this embodiment can easily be added to an existing electronic component mounter 1.

Fourth Embodiment

An electronic component mounter of this embodiment differs from the electronic component mounter of the first embodiment in that in the board identity determination method, the removed board is distinguished from the reinstalled board after the control device images all mounting coordinates. Here, only the different features will be described. FIG. 9 illustrates a flowchart (a latter half portion) of the board identity determination method executed by the electronic component mounter of this embodiment. The same signs will be given to portions corresponding to those illustrated in FIG. 6. The front half portion (i.e., the steps before S7) of the flowchart is similar to that in FIG. 6. In the following description, FIGS. 1 to 6 will also be referred to as required.

Following S6 in FIG. 6, the operator inputs a reply to a board check request message into display/input device 6 (S7 in FIG. 9). That is, the operator inputs the results of checking the mounting state of $k_{th}$ electronic component 91. Control device 8 images all electronic component 91 mounting coordinates irrespective of the results of the check by the operator (S21 in FIG. 9). When determining based on the results of the check executed by the operator that "$k_{th}$ electronic component 91 is removed" (S8 in FIG. 9), control device 8 determines based on image G whether electronic components 91 are present at 1st to $k-1_{th}$ mounting coordinates (S23 in FIG. 9). When electronic components 91 are mounted on 1st to $k-1_{th}$ mounting coordinates, the mounting state of electronic component s91 on relevant board 90 coincides with the mounting state of electronic components 91 on reinstalled board (i.e., the board from which $k_{th}$ electronic component 91 is removed) 90. From this, control device 8 determines that removed board 90 and reinstalled board 90 are identical (S13 in FIG. 9). Thereafter, control device 8 resumes mounting of electronic components 91 from $k_{th}$ electronic component 91 (S14 in FIG. 9).

On the other hand, returning to S23 in FIG. 9, when electronic component 91 is not mounted on at least one of 1st to $k-1_{th}$ mounting coordinates as a result of determining whether electronic components 91 are present at 1st to $k-1_{th}$ mounting coordinates based on image G, the mounting state of electronic components 91 on relevant board 90 does not coincide with the mounting state of electronic components 91 on reinstalled board (board from which $k_{th}$ electronic component 91 is removed) 90. From this, control device 8 determines that removed board 90 and reinstalled board 90 are not identical (S19 in FIG. 9). In this case, control device 8 resumes mounting of electronic components 91 on all mounting coordinates on which electronic components 91 are not mounted (S14 in FIG. 9).

On the other hand, returning to S8 in FIG. 9, when not determining based on the results of the check executed by the operator that "$k_{th}$ electronic component 91 is removed," control device 8 determines based on image G whether electronic components 91 are present at 1st to $k_{th}$ mounting coordinates (S26 in FIG. 9).

When electronic components 91 are mounted on the 1st to $k_{th}$ mounting coordinates, the mounting state of electronic components 91 on relevant board 90 coincides with the mounting state of electronic components 91 on reinstalled board 90. From this, control device 8 determines that removed board 90 and reinstalled board 90 are identical (S13 in FIG. 9). Thereafter, control device 8 resumes mounting electronic components 91 from $k+1_{th}$ electronic component 91 (S14 in FIG. 9).

On the other hand, returning to S26 of FIG. 9, when electronic component 91 is not mounted on at least one of 1st to $k_{th}$ mounting coordinates as a result of determining the presence of electronic components 91 at 1st to $k_{th}$ mounting coordinates based on image G, the mounting state of electronic components 91 on relevant board 90 does not coincide with the mounting state of electronic components 91 on reinstalled board 90. From this, control device 8 determines that removed board 90 and reinstalled board 90 are not identical (S19 in FIG. 9). In this case, control device 8 resumes mounting of electronic components 91 on all mounting coordinates on which electronic components 91 are not mounted (S14 in FIG. 9).

The electronic component mounter of this embodiment and the electronic component mounter of the first embodiment provide the same working effects in relation to common portions in the configuration. With the electronic component mounter of the embodiment, removed board 90 is distinguished from reinstalled board 90 (S23, 26 in FIG. 9) after all the mounting coordinates are imaged once (S21 in FIG. 9). Due to this, additional imaging of reinstalled board 90 after removed board 90 and reinstalled board 90 is unnecessary after removed board 90 and reinstalled board are found not to be identical (S19 in FIG. 9). Mounting electronic components 91 can be resumed quickly for all the mounting coordinates on reinstalled board 90 where electronic components 91 are not mounted based on image G acquired in S21 in FIG. 9 (S14 in FIG. 9).

Others

Embodiments of the electronic component mounter of the present disclosure have been described above. However, the mode for carrying out the present disclosure is not limited to the embodiments described above. The present disclosure can also be carried out by various modified forms or improved forms that those skilled in the art can make.

The contents of the board identity determination method illustrated in FIGS. 6, 9 are not particularly limited thereto. For example, control device 8 illustrated in FIG. 2 may execute the following board identity determination method. First, control device 8 displays a board check request message (S2 in FIG. 6) for multiple electronic components 91 on display/input device 6 after mounting of all the electronic components has been completed (specifically, mounting sequences for all the electronic components have been completed). Next, the operator removes board 90 from electronic component mounter 1, checks multiple electronic components 91, executes a repair or the like as required, and reinstalls board 90 in electronic component mounter 1. Following this, control device 8 images all the mounting coordinates for all electronic components 91 (S21 in FIG. 9). Then, control device 8 resumes mounting electronic components 91 on all the mounting coordinates on reinstalled board 90 where electronic components 91 are not mounted based on image G (S14 in FIG. 9).

By doing this, a board check request message for multiple electronic components 91 is displayed comprehensively on display/input device 6. Due to this, the operator can comprehensively check the mounting state of multiple electronic components 91 that may not be mounted properly. Further, control device 8 resumes mounting electronic components 91 based not on the results of the check by the operator but based on image G. Due to this, the operator does not have to input the results of the check into display/input device 6 after reinstalling board 90 (S7 in FIG. 6). Further, the operator does not have to distinguish between removed board 90 and reinstalled board 90.

The types of light sources for light section 39 and imaging device 34b are not particularly limited. The light source may be an LED, an incandescent lamp, a fluorescent lamp, a halogen lamp, a discharge lamp, a laser light source, or the like. Further, the color of the light beam (direct light L1, L2, reflected light L3) is not particularly limited. The color of the light beam may be controlled as required to facilitate the detection of through holes 901. Image G may be a monochrome or color image.

The type of imaging device 34b is not particularly limited. Imaging device 34b may include a complementary metal-oxide semiconductor (CMOS) area sensor. The resolution of imaging device 34b is not particularly limited. The reference state illustrated in FIG. 5(a) and the other states (for example, the normal mounting state illustrated in FIG. 5(b), the inclined mounting state illustrated in FIG. 5(c)) should be determined from image G. A photodetector (a diode or the like) may be disposed in place of imaging device 34b as the light receiving section. Further, a cutout portion penetrating board 90 in the front-rear direction may be disposed in place of through hole 901 as the penetrating portion. The "information regarding the mounting coordinate" is not limited to image G. For example, the information may be the quantity of light that arrives at the light receiving section.

As a component conveyance device, a body clamp configured to grip component main body 910 may be attached to head main body 340 of mounting head 34a in place of suction nozzle 341. Further, a lead clamp configured to grip lead 911 may be attached. The component conveyance device may be exchanged as required according to the type and shape of electronic components 91. The type of motor M is not particularly limited. For example, motor M may be a linear motor, a stepping motor, or the like.

Imaging device 34b need not be disposed integrally with mounting head 34a. Imaging device 34b may be fixed to housing 35 illustrated in FIG. 1 or the like as light section 39 illustrated in FIG. 7 is. That is, when seen from above, imaging device 34b may be disposed in such a manner that imaging device 34b is superposed above all the mounting coordinates (through holes 901) on board 90. By doing so, a bird's-eye view of all through holes 901 can be imaged without moving imaging device 34b. Consequently, a driving mechanism (for example, first slide 32 or second slide 33, illustrated in FIG. 1) for imaging device 34b becomes unnecessary. The positional relationship between imaging device 34b and light section 39 is not particularly limited. For example, light section 39 and imaging device 34b may be disposed on the upper side (i.e., the front face) of board 90 and on the lower side (i.e., the rear face) of board 90, respectively.

The application of the electronic component mounter of the present disclosure is not particularly limited. For example, all the mounting coordinates for electronic components 91 may be imaged when the power supply is restored after failing (S21 in FIG. 9). By doing this, the mounting state of electronic components 91 on board 90 can be checked. The electronic component mounter of the present disclosure is preferable in confirming the actual mounting state of electronic components on board 90 without relying on a record in memory section 801 of control device 8. Further, as an example, assume a case where N electronic components 91 are sequentially mounted (from 1st to $N_{th}$ electronic components) on N mounting coordinates on board 90 by electronic component mounter 1 illustrated in FIG. 1. If the supply of $k_{th}$ electronic components 91 is short (for example, out of stock), the stage in the mounting sequence of mounting relevant electronic component 91 may be skipped first to execute all the other stages in the mounting sequence, and then all the mounting coordinates for electronic components 91 may be imaged next (S21 in FIG. 9). Thereafter, after $k_{th}$ electronic components 91 are replenished, $k_{th}$ electronic components 91 may be additionally mounted based on image G in the current electronic component mounter 1 or electronic component mounter 1 in a later step.

REFERENCE SIGNS LIST

1: electronic component mounter; 2: base; 3: module; 4: holding section; 5: image processing device; 6: display/input device; 8: control device; 9: tray feeder; 30: device table; 31: first guide rail; 32: first slide; 33: second slide; 34a: mounting head; 34b: imaging device; 35: housing; 36: third guide rail; 37: third slide; 38: fourth slide; 39: light section; 40: wall section; 41: conveyor; 80: computer; 81: input/output interface; 90: board; 91: electronic component; 92: arm; 93: tray; 320: second guide rail; 340: head main body; 341: suction nozzle; 342: light source; 370: fourth guide rail; 390: reflective body; 800: calculating section; 801: memory section; 901: through hole (penetrating portion); 902: hole surrounding portion; 910: component main body; 911: lead; G: image (information on mounting coordinate); L1: direct light; L2: incident light; L3: reflected light; M: motor.

The invention claimed is:

1. An electronic component mounter, comprising:
   a holding section configured to hold a board having a penetrating portion penetrating the board in a front-rear direction and into which a lead of an electronic component is inserted;
   a light section facing a front face or a rear face of the board when the board is held by the holding section, which is configured to irradiate a light beam on to the board, the light beam being reflected light, and
   a light receiving section facing an opposite face of the board opposite to the front face or the rear face of the board that the light section faces when the board is held by the holding section, which is configured to receive the light beam via the penetrating portion, the light receiving section including a light source, and the light section including a reflective body configured to reflect incident light from the light source to irradiate reflected light on to the board.

2. The electronic component mounter according to claim 1,
   wherein the light receiving section constitutes an imaging device configured to image the penetrating portion.

3. The electronic component mounter according to claim 1,
   wherein the penetrating portion is disposed to correspond with mounting coordinates for the electronic component on the board,
   the electronic component mounter comprises a control device configured to acquire information regarding the mounting coordinates from the light receiving section,
   a state where nothing is inserted into the penetrating portion is referred to as a reference state, and
   the control device determines whether the electronic component is present at the mounting coordinates by comparing the information in the reference state with the information actually acquired.

* * * * *